US008155593B2

(12) United States Patent
Fehr

(10) Patent No.: US 8,155,593 B2
(45) Date of Patent: Apr. 10, 2012

(54) METHOD FOR ALLOCATING A FREQUENCY FOR A WIRELESS AUDIO COMMUNICATION

(75) Inventor: Matthias Fehr, Wedemark (DE)

(73) Assignee: Sennheiser electronic GmbH & Co. KG, Wedemark (DE)

( * ) Notice: Subject to any disclaimer, the term of this patent is extended or adjusted under 35 U.S.C. 154(b) by 1012 days.

(21) Appl. No.: 11/558,185

(22) Filed: Nov. 9, 2006

(65) Prior Publication Data

US 2007/0117580 A1 May 24, 2007

(30) Foreign Application Priority Data

Nov. 11, 2005 (DE) .......................... 10 2005 054 258

(51) Int. Cl.
*H04B 15/00* (2006.01)
(52) U.S. Cl. ...... 455/62; 455/66.1; 455/67.13; 455/450; 455/509; 455/517; 455/556.1; 381/94.3; 381/98
(58) Field of Classification Search .................... 455/62, 455/66.1, 67.11, 67.13, 450, 458, 509, 517, 455/552.1, 556.1, 68, 71; 370/248, 348, 370/431; 375/133; 381/71.14, 94.1, 94.3, 381/98, 122
See application file for complete search history.

(56) References Cited

U.S. PATENT DOCUMENTS

| 6,035,212 | A | * | 3/2000 | Rostoker et al. ............ 455/552.1 |
| 7,027,775 | B2 | * | 4/2006 | Kamimura ...................... 455/71 |
| 2003/0036357 | A1 | | 2/2003 | McGowan |
| 2003/0087667 | A1 | * | 5/2003 | Taniguchi et al. ............. 455/556 |
| 2007/0053527 | A1 | * | 3/2007 | Barbieri et al. ............... 381/104 |

FOREIGN PATENT DOCUMENTS

| DE | 35 17 818 | 5/1988 |
| DE | 100 35 824 | 2/2002 |
| DE | 102 01 068 | 7/2003 |
| DE | 101 37 404 | 9/2003 |
| EP | 1 309 222 | 5/2003 |
| JP | 10093449 | 4/1998 |

* cited by examiner

*Primary Examiner* — Shaima Q Aminzay
(74) *Attorney, Agent, or Firm* — Frommer Lawrence & Haug LLP

(57) ABSTRACT

A method is provided for allocating a frequency for wireless audio communications. A request is received for a frequency for wireless audio communications. The request contains the location, the time period, the quantity of required wireless communications paths and/or the available equipment for the wireless audio communications. This request is compared with information about frequency use which is stored in databases. Possible frequency ranges are outputted, and the possible frequency ranges are allocated to transmitting and/or receiving units of the requested audio communications.

2 Claims, 1 Drawing Sheet

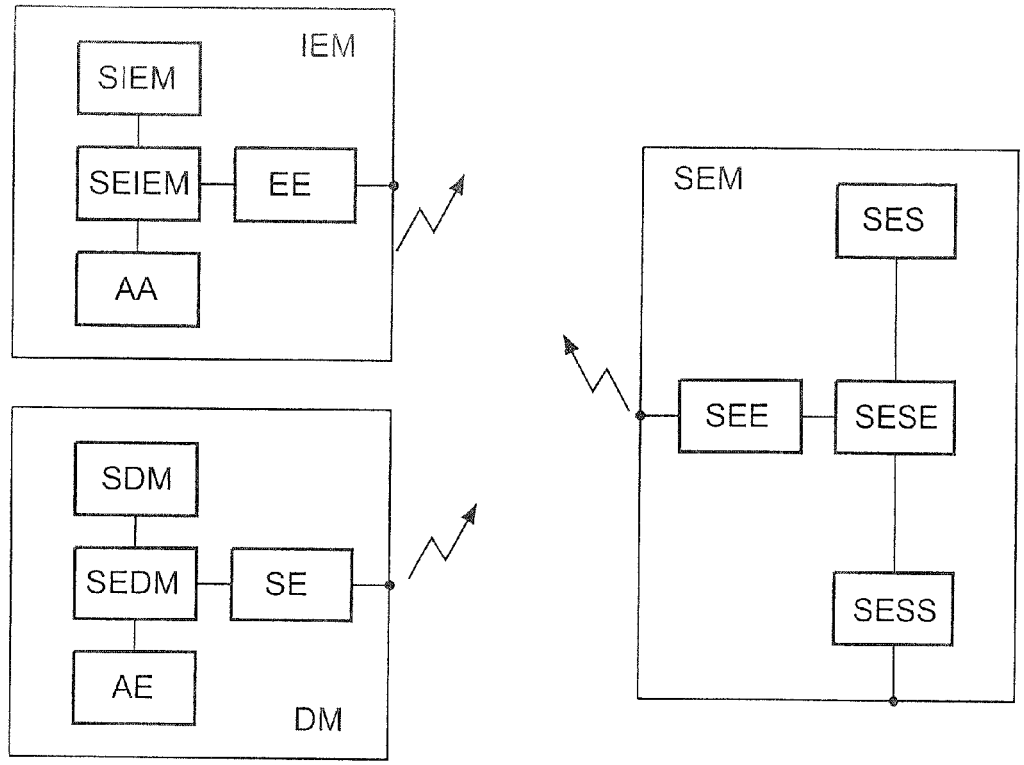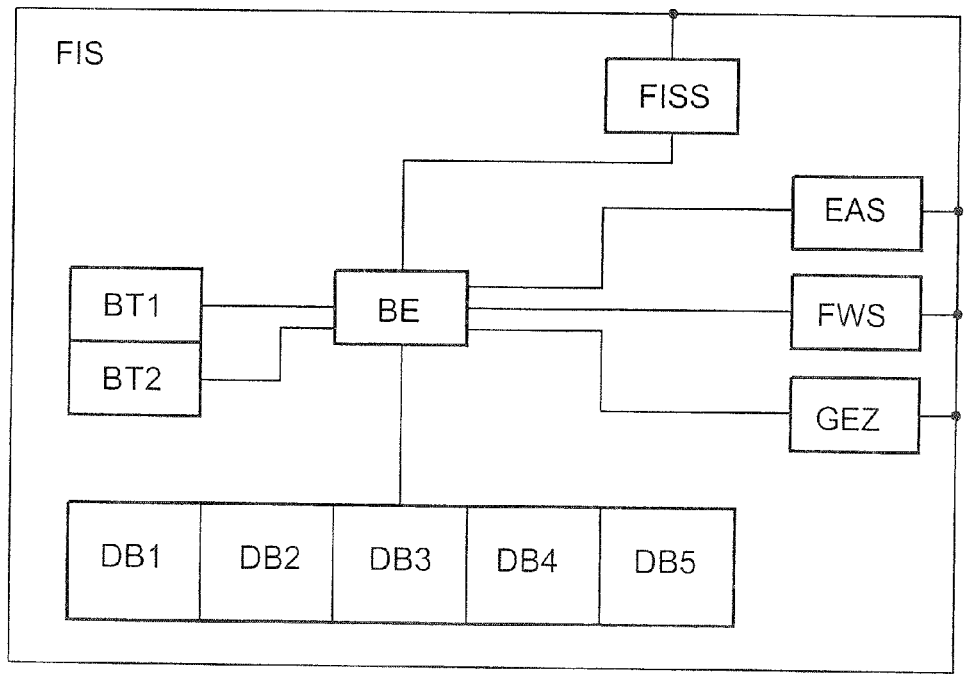

METHOD FOR ALLOCATING A FREQUENCY FOR A WIRELESS AUDIO COMMUNICATION

CROSS-REFERENCE TO RELATED APPLICATION

This application claims priority of German Application No. 10 2005 054 258.1, filed Nov. 11, 2005, the complete disclosure of which is hereby incorporated by reference.

BACKGROUND OF THE INVENTION a) Field of the Invention

The present invention is directed to a method for allocating a frequency for wireless audio communications, a frequency information server, a transmitter-receiver device, mobile wireless audio communications apparatus, and a wireless microphone reception system.

b) Description of the Related Art

Wireless microphones and wireless in-ear monitors are becoming increasingly popular, while the frequencies available for their operation remain limited. Therefore, the available frequency ranges must be used multiple times, for example, with respect to place or time. Consequently, usable microphone frequencies must be calculated and correspondingly coordinated. Active protection against interference or reduction of interference is made possible by taking into account external sources of interference arising from other wireless applications.

OBJECT AND SUMMARY OF THE INVENTION

Therefore, it is the primary object of the present invention to provide a method for allocating frequencies for wireless audio communications which makes efficient use of the available frequency ranges.

This object is met, in accordance with the invention, by a method for allocating a frequency for wireless audio communications comprising the following steps: receiving a request for a frequency for wireless audio communications, wherein the request contains the location, the time period, the quantity of required wireless communications paths and/or the available equipment for the wireless audio communications; comparing the request with information about frequency allocation which is stored in databases; displaying possible frequency ranges; and allocating the possible frequency ranges to transmitter units and/or receiver units of the requested wireless audio communication.

Also in accordance with the invention, the object is met by a frequency information server for allocating a frequency for a wireless audio communications path comprising an input-output interface for receiving requests for a frequency for a wireless audio communications path, wherein the request contains the location, the time period, the quantity of wireless audio communications paths and/or the available equipment for the audio communications path; at least one database for storing information about utilized frequency, location, terminal, types of equipment and/or the users of wireless audio communications paths; a calculation unit for coordinating the requested audio communications path with the information stored in the at least one database and for allocating transmission parameters of the requested wireless audio communications path; and a frequency information server interface for outputting the transmission parameters of the requested wireless audio communications paths which are assigned by the calculation unit.

Further in accordance with the invention, the object is met by a transmitter receiver device for a wireless audio communications path comprising a transmitter-receiver unit for wireless transmission and reception, a transmission-reception interface for receiving allocated transmission parameters for the wireless audio communications path of an external frequency server; a server for storing the parameters of the wireless audio communications path which are received by the transmission reception interface; and a control unit for controlling the transmitter-receiver unit based on the transmission parameters stored in the storage.

Accordingly, a method is provided for allocating a frequency for wireless audio communications. A request for a frequency for wireless audio communications is received. The request contains the location, the time period, the quantity of required wireless communication paths and/or the available equipment for wireless audio communications. This request is compared with information about frequency traffic that is stored in databases. Possible frequency ranges are given out and the possible frequency ranges are assigned to transmitting and/or receiving units of the requested wireless audio communication, The flexibility, availability, quality and coordination of the available frequency ranges can be improved by the method according to the invention.

The invention is also directed to a frequency information server for allocating a frequency for a wireless audio communications path. The server has an input-output interface for receiving requests for a frequency for a wireless audio communications path. This request can have the location, the time period, the quantity of wireless audio communications paths and/or the available equipment for the wireless audio communications path. Further, the frequency information server has at least one database for storing information about the utilized frequency, location, terminal, types of equipment and/or the user of wireless audio communications paths. A calculation unit coordinates the requested audio communications paths with the information stored in the at least one database. The transmission parameters of the requested wireless audio communications path are allocated. Further, the frequency information server has a frequency information server interface for giving out the transmission parameters of the requested wireless audio communications path which are assigned by the calculation unit.

The invention is also directed to mobile wireless audio communications apparatus with a transmitter-receiver device for transmitting and/or receiving wirelessly transmitted audio signals. Further, the audio communications apparatus has a storage for storing transmission parameters for the wireless audio communications path. A control unit controls the transmitter-receiver unit based on the transmission parameters stored in the storage.

The invention will be described in detail in the following with reference to the drawing.

BRIEF DESCRIPTION OF THE DRAWING

FIG. 1 shows a block diagram of a wireless transmission-reception system according to an embodiment example of the invention.

DESCRIPTION OF THE PREFERRED EMBODIMENTS

FIG. 1 shows a block diagram of a wireless transmission-reception system according to a first embodiment example of the invention. The system includes a wireless transmitter-receiver device SEM, mobile audio communications apparatus, i.e., a wireless in-ear monitor IEM, a wireless microphone DM, and a frequency information server FIS. The wireless microphone DM registers audio signals and transmits these audio signals to the transmitter-receiver device SEM. The transmitter-receiver device SEM sends audio signals wirelessly to the in-ear monitor IEM which converts the received signals into an audio signal.

Also shown is an external frequency information server FIS which serves to determine the transmission-reception parameters of the in-ear monitor IEM, of the wireless microphone DM, and of the transmitter-receiver device SEM and to convey them to the transmitter-receiver device SEM. Based on this information and parameters such as the transmitting-receiving frequency, the transmitting power, the transmitting time, etc., a wireless communications path can be produced between the transmitter-receiver device SEM, the in-ear monitor IEM and the wireless microphone DM.

Accordingly, the transmitter-receiver device SEM has a transmitter-receiver interface SESS, a control unit SESE, a transmitter-receiver storage SES and a transmitter-receiver unit SEE. The transmitter-receiver device SEM receives information and parameters for the required reception paths from an external wireless information server FIS via this transmitter-receiver interface SESS. This information is stored in the transmitter-receiver storage SES. The control unit SESE controls the wireless transmitter-receiver unit SEE based on this information and parameters. In particular, control or adjustment of the frequency and of the transmission-reception power of the wireless communications paths provided by the transmitter-receiver unit SEE is carried out in this way. The frequency and the respective transmission-reception power of the transmitter-receiver unit SEE are preferably first transmitted to the in-ear monitor IEM and/or the wireless microphone DM during the initialization of the in-ear monitor IEM and/or of the wireless microphone DM. This can be carried out, for example, on a fixedly defined initialization frequency which is stored in the transmitter-receiver device SEM and in the in-ear monitor IEM and/or in the wireless microphone DM and is first selected and adjusted when initializing the respective communications paths.

The in-ear monitor IEM has a reception unit EE, a control unit SEIEM, a storage SIEM and an audio output AA. Preferably during the initialization of the wireless communications path between the transmitter-receiver device SEM and the wireless in-ear monitor IEM, the reception unit EE receives the parameters of the communications path such as the frequency and the transmission-reception power and stores them in the storage SIEM. During or after the initialization, the reception unit EE adjusts to the respective frequency and the corresponding reception power by means of the control unit SEEM based on the parameters stored in the storage SIEM. Thereafter, by means of the reception unit EE, the in-ear monitor IEM can receive the signals which are wirelessly transmitted by the transmitter-receiver device SEM and can decode the audio signals contained therein and output them out via the audio output AA.

Preferably during the initialization of the communications path between the transmitter-receiver device SEM and the wireless microphone DM, the corresponding information or parameters pertaining to the communications transmission path are first conveyed from the transmitter-receiver device SEM to the wireless microphone DM. The wireless microphone DM has a transmission unit SE (which can also receive data and signals), a control unit SEDM, a storage SDM, and an audio input AE. The parameters of the communications transmission path which are transmitted by the transmitter-receiver device during initialization are stored in the storage SDM. The control unit SEDM then adjusts the respective parameters of the communications transmission, e.g., the frequency and the transmitting power of the wireless microphone, based on the parameters stored in the storage SDM. Accordingly, the audio signals received or recorded by the audio input AE are encoded by the control unit SEDM and are transmitted or conveyed to the transmitter-receiver device SEM via the transmitting unit SE based on the adjusted parameters of the communications transmission path.

The parameters of the communications transmission path can be transmitted by cables or wirelessly, e.g., via an infrared transmission path, ultrasonic transmission path, or WLAN transmission path. In addition or alternatively, another, separate wireless link can also be provided for this purpose based, e.g., on an infrared transmission path, ultrasonic transmission path, WLAN transmission path, or HF transmission path.

In the following, the construction and operation of the frequency information server FIS will be described in more detail. The server has an input-output interface EAS, a plurality of databases DB1-DB5, a plurality of calculation tools BT1 and BT2, and a calculation unit BE. The frequency information server FIS receives, via the input/output interface EAS, requests or data and information regarding the location, time period, quantity of wireless transmission paths and available equipment for a projected event. Accordingly, for example, the equipment that is available in principle and its technical parameters, i.e., the data of all known transmitters/receivers are stored in the database. Based on this information and on the information stored in the databases DB1-DB5 and based on the information determined by the calculation tools, the calculation unit BE calculates a frequency range and corresponding transmission-reception powers for the desired wireless transmission paths. The information and parameters are conveyed from the calculation unit BE to the frequency information server interface FISS. The information and parameters are then transmitted from the frequency information server interface FISS to a corresponding transmitter-receiver device SEM wirelessly or by cables.

Information on wireless microphones and wireless in-ear monitors with respect to frequency, location, terminal, type of equipment, and user is stored in the first database DB1, i.e., scheduled wireless transmission paths for wireless microphones or wireless in-ear monitors are stored in this database. These personal data and/or location data may be stored in an anonymous manner if required. Information for frequency use of primary communications services is stored in the second database DB2. This information can be, for example, information about a location and field strength predictions of TV transmitters. This applies in particular to a frequency range in which wireless transmission paths can be impaired directly or through intermodulation. Information for frequency use of other wireless applications which are relevant for the frequency range in which a wireless transmission path can be impaired directly or through intermodulation can be stored in the third database DB3. Information about technical equipment parameters for determining the working range and signal/noise ratio as a function of sensitivity, intermodulation, an occupied bandwidth, etc. is stored in the fourth database DB4. Information about building parameters and terrain parameters can be stored in the fifth database DB5.

The information in databases DB1-DB4 is preferably updated regularly. Alternatively or in addition, the information in databases DB1-DB5 can be updated based on the requests received through the input-output interface EAS. As an alternative to the embodiment example shown in FIG. 1, the databases can be provided entirely or partially external to the frequency information server FIS, for example, on an external server insofar as it is ensured that the frequency information server FIS can access this information without difficulty.

The first calculation tool BT1 serves to predict propagation parameters in buildings or terrain. The second calculation tool BT2 serves for intermodulation calculation. These external tools BT1-BT2 can likewise be arranged external to the frequency information server insofar as it is ensured that the frequency information server FIS can access the results of the calculation tools.

Further, the frequency information server can have a frequency management interface FWS by means of which the frequency information server can communicate with the respective servers of a frequency management agency or regulatory body in order to ensure the monitoring tasks of the frequency management agency or regulatory body. Further, a regulation of licenses can be ensured in this way. By means of the frequency management interface FWS, an external frequency management agency or regulatory body can access databases of the frequency information server FIS and can block or release frequencies or frequency ranges entirely or occasionally.

Further, the frequency information server FIS can have a billing interface GEZ by means of which a billable allocation of frequencies for the requested wireless transmission paths can be calculated. This can be carried out, for example, in such a way that the corresponding billing information is conveyed via the billing interface GEZ to an external server for billing.

The input-output interface EAS of the frequency information server FIS is preferably designed in such a way that external users can access this interface, for example, via the Internet and can go online to enter the desired information about location, time period, quantity of wireless transmission paths and the like.

Continuously updated information on current and projected frequency use to wireless communications transmission paths for wireless microphones and in-ear monitors is preferably acquired in databases DB1-DB5. During the scheduling of wireless transmission paths for wireless microphones and/or in-ear monitors, one or more desired locations are indicated, possibly with routing, the intended use period and the intended quantity of microphone paths and/or in-ear monitor paths and the utilized equipment. The usable frequencies and time periods are coordinated and correspondingly allocated by combining these input parameters with the information for current or projected regional frequency use, local propagation characteristics and specific technical system characteristics of the microphones and in-ear monitors, which information is already known and stored in the databases. Frequency parameters and power parameters for microphone programming and/or in-ear monitor programming are provided via the standardized interfaces. The programming is preferably carried out automatically. Any required communications with the responsible frequency management agencies or regulatory bodies are preferably generated and transmitted automatically. Transaction costs are calculated and settled in a corresponding manner.

In the following, a frequency allocation for a wireless transmission path based on the frequency information server described above will be described in more detail by way of example. A connection to the input-output interface EAS of the frequency information server FIS can be established over the Internet. Information about the location, required time period, quantity of required wireless transmission paths and available equipment can be entered via this interface EAS.

Based on the entered planning information and technical system simulation, the feasibility of the desired wireless transmission paths for this time period at this location is checked and preferably displayed. The provisionally determined frequency assignment can already be reserved so that this frequency assignment at this location at this time cannot be allocated to someone else. As soon as the calculation unit BE of the frequency information server has determined on the basis of the information in the databases that desired wireless transmission paths are available, the corresponding frequency ranges are securely allocated for the time period at this location. When the use of the indicated wireless transmission paths requires a license or is billable, the corresponding information is conveyed in a corresponding manner via the billing interface GEZ. An authorization for the intended frequency use can then be effected. The allotted frequencies and/or transmission-reception powers are entered in the frequency database for the allocation period and allocation location and are accordingly blocked for other applications. Required information is conveyed to the corresponding national regulatory bodies. If the scheduling is terminated or interrupted, the provisional frequency reservation is canceled.

The system described above proves advantageous because a corresponding allocation of the transmission parameters for the wireless communications transmission paths can be carried out in a standardized manner within a few minutes. The detected or displayed data can be provided with varying levels of anonymity for the purpose of data protection. Further, scenarios for event scheduling, e.g., the selection of suitable equipment, can also be carried out in principle. Frequency groups or frequency ranges can be allotted with time limits for independent offline frequency scheduling, for example, for larger events.

The system described above is relevant for a detailed national and/or regional frequency allocation (in the neighborhood of frontiers, the frequency allocation must be coordinated with the neighboring country so that an international frequency allocation can also be made possible), for the description and effect of the primary frequency bank use, and for the description and effect of neighboring frequency use. Further, technical characteristics of the wireless microphones and wireless in-ear monitors which are used or will be used and the technical characteristics of neighboring microphones and in-ear monitors can be taken into account. Location documents and field documents can be used for field strength calculation. Further, absorption parameters of building materials and buildings can be detected and stored in the databases. The transmitter evaluation and/or receiver evaluation can be carried out, for example, by system simulation techniques.

According to an alternative embodiment example which is based on the first embodiment example described above, the wireless microphones DM, in-ear monitors IEM and transmitter-receiver device SEM can each have an IP address which can be stored, for example, in the respective storage. Accordingly, each wireless microphone, each in-ear monitor and each transmitter-receiver unit can be controlled directly by the frequency information server FIS or a corresponding communication can be made possible.

The invention is also directed to a frequency information system for allocating a frequency for a wireless audio communications path. The system has an input-output interface for receiving requests for a frequency for a wireless audio communications path. This request can have the location, the time period, the quantity of wireless audio communications paths and/or the available equipment for the wireless audio communications path. Further, the frequency information system has at least one database for storing information about the used frequency, the location, the terminal, types of equipment and/or the user of wireless audio communications paths. A calculation unit coordinates the requested audio communications paths with the information stored in the at least one database. The transmission parameters of the requested wireless audio communications path are allocated. Further, the frequency information system has a frequency information server interface for giving out the transmission parameters of the requested wireless audio communications path which are allocated by the calculation unit.

The wireless path or audio communications path indicated in the embodiment examples described above pertain to a wireless transmission path by means of which audio signals are transmitted and received. This wireless path or audio communications path can be, for example, an HF transmission path (or UHF transmission path), an infrared transmission path, an ultrasonic transmission path, a WLAN transmission path or the like. The wireless path or wireless audio communications path is preferably an HF transmission path, and the frequencies of this transmission path are subject to certain restrictions with respect to licensing or release.

The transmitter-receiver device SEM described above is preferably a receiver for a wireless microphone and/or a transmitter for an in-ear monitor or wireless headphones or a wireless headset. This apparatus can be arranged in an audio signal processing device, e.g., a mixing board, or in a TV camera or a video camera with a wireless transmitter-receiver unit.

Although the transmitter-receiver device SEM according to the first embodiment example has a transmitter-receiver interface, a transmitter-receiver device having no direct interface to the frequency information server can also be provided alternatively. This can be carried out, for example, in that another audio signal processing device or a computer is connected to the transmitter-receiver device SEM.

The wireless path and audio communications paths described above can also be provided, for example, between a wireless microphone and a TV camera or video camera with a corresponding wireless receiver unit. The wireless receiver unit of the camera can then convey the audio signal received from the wireless microphone to another wireless receiver device. Alternatively or in addition, an audio signal can be conveyed from the other wireless receiver device to the camera which then conveys the audio signal to a wireless receiver. Accordingly, staging directions can be conveyed to a reporter via the camera. In this connection, the wireless microphone and the camera can both be designed as mobile wireless audio communications apparatus. Alternatively or in addition, the camera can also be designed as a transmitter-receiver device for a wireless audio communications path. The allocation of the parameters of these wireless transmission paths or audio communications paths which can implement wireless audio can be carried out in the manner described above.

While the foregoing description and drawings represent the present invention, it will be obvious to those skilled in the art that various changes may be made therein without departing from the true spirit and scope of the present invention.

What is claimed is:

1. A method for allocating a frequency for wireless audio communications between at least one wireless audio transmitter unit and at least one wireless audio receiver unit, the method comprising the following steps:
   receiving a request for a frequency for wireless audio communication between the at least one wireless audio transmitter unit and the at least one wireless audio receiver unit, wherein the request contains a location, a time period, a quantity of required wireless communications paths, and available equipment for the at least one wireless audio transmitter unit and the at least one wireless audio receiver unit;
   comparing the request with information about frequency allocation which is stored in databases on an external frequency information server;
   determining and displaying possible frequency ranges for the wireless audio communication between the at least one wireless audio transmitter unit and the at least one wireless audio receiver unit; and
   allocating the possible frequency ranges to the at least one wireless audio transmitter unit and the at least one wireless audio receiver unit for the required wireless audio communication;
   wherein the information in the databases are updated regularly based on the received requests; and
   wherein the databases contain information on all available equipment for the wireless audio transmitter unit and the wireless audio receiver unit for wireless audio communication as well as the technical parameters of the wireless audio transmitter unit and the wireless audio receiver unit.

2. The method according to claim 1;
   wherein information about the frequencies, locations, terminals, types of equipment, and users of wireless audio communications paths are stored in the database; and
   wherein information for frequency use of primary communications services and a field strength prediction of television transmitters is stored in the database.

* * * * *